United States Patent
Huang

(10) Patent No.: US 10,818,046 B2
(45) Date of Patent: Oct. 27, 2020

(54) MAGNETIC RESONANCE IMAGING

(71) Applicant: Shanghai Neusoft Medical Technology Co., Ltd., Shanghai (CN)

(72) Inventor: Feng Huang, Shanghai (CN)

(73) Assignee: Shanghai Neusoft Medical Technology Co., Ltd., Shanghai (CN)

(*) Notice: Subject to any disclaimer, the term of this patent is extended or adjusted under 35 U.S.C. 154(b) by 89 days.

(21) Appl. No.: 16/157,123

(22) Filed: Oct. 11, 2018

(65) Prior Publication Data
US 2019/0122398 A1    Apr. 25, 2019

(30) Foreign Application Priority Data
Oct. 23, 2017 (CN) ............ 2017 1 0993798

(51) Int. Cl.
*G06T 11/00* (2006.01)
*G01R 33/56* (2006.01)
(Continued)

(52) U.S. Cl.
CPC ........ *G06T 11/005* (2013.01); *G01R 33/4818* (2013.01); *G01R 33/5608* (2013.01); *G01R 33/5611* (2013.01); *G06T 9/00* (2013.01); *G06T 11/006* (2013.01); *G01R 33/56308* (2013.01); *G06T 2211/412* (2013.01); *G06T 2211/424* (2013.01)

(58) Field of Classification Search
CPC ....... G06T 11/005; G06T 9/00; G06T 11/006; G06T 2211/412; G06T 2211/424; G06T 2207/10088; G06T 2207/20056; G01R 33/5611; G01R 33/5608; G01R 33/4818; G01R 33/56308
See application file for complete search history.

(56) References Cited

U.S. PATENT DOCUMENTS

| | | | |
|---|---|---|---|
| 2007/0182411 A1* | 8/2007 | Bammer | G01R 33/4824 324/307 |
| 2016/0025829 A1* | 1/2016 | Koktzoglou | G01R 33/4824 324/309 |
| 2017/0038452 A1* | 2/2017 | Trzasko | G01R 33/56572 |

OTHER PUBLICATIONS

Klaas P. Pruessmann et al, SENSE: Sensitivity Encoding for Fast MRI, Magnetic Resonance in Medicine, in 1999, p. 42:952-962.
(Continued)

*Primary Examiner* — Qian Yang
(74) *Attorney, Agent, or Firm* — Kilpatrick Townsend & Stockton, LLP

(57) ABSTRACT

Methods and devices for reconstructing a magnetic resonance image, and a non-transitory machine readable storage medium are provided. In an example, the method includes: obtaining a previous image; for each of channels, collecting k-space data of the channel by a partial sampling technology, generating original k-space data of the channel by mapping the previous image into k-space of the channel, and obtaining residue k-space data of the channel by subtracting the original k-space data of the channel from the k-space data of the channel; reconstructing a residue image with the residue k-space data of each of the channels by taking sparsity of the residue image as a constraint term and a difference between virtual residue k-space data of the channel and the residue k-space data of the channel as a data fidelity term; and obtaining a reconstructed magnetic resonance image by adding the residue image to the previous image.

12 Claims, 2 Drawing Sheets

(51) Int. Cl.
    *G01R 33/48*     (2006.01)
    *G06T 9/00*     (2006.01)
    *G01R 33/561*     (2006.01)
    *G01R 33/563*     (2006.01)

(56) References Cited

OTHER PUBLICATIONS

Feng Huang et al, Partial Fourier Reconstruction Through Data Fitting and Convolution in k-Space, Magnetic Resonance in Medicine, in 2009, p. 62:1261-1269.

Fa-Hsuan Lin et al, Parallel Imaging Reconstruction Using Automatic Regularization, Magnetic Resonance in Medicine, in 2004, p. 51:559-567.

Feng Huang et al, A Rapid and Robust Numerical Algorithm for Sensitivity Encoding with Sparsity Constraints: Self-Feeding Sparse SENSE, Magnetic Resonance in Medicine, in 2010, p. 64:1078-1088.

Mark A. Griswold et al, Generalized Autocalibrating Partially Parallel Acquisitions (GRAPPA). Magnetic Resonance in Medicine, in 2002, p. 47:1202-1210.

* cited by examiner

MAGNETIC RESONANCE IMAGING

CROSS REFERENCE TO RELATED APPLICATIONS

This application claims priority to Chinese Patent Application No. 201710993798.8, filed on Oct. 23, 2017, the entire content of which is incorporated herein by reference.

BACKGROUND

Due to relatively high soft tissue contrast and spatial resolution, Magnetic Resonance Imaging (MM) may obtain shape information and function information of an examined part and select imaging parameters and imaging slices as needed. This has become an important manner of medical imaging technology.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MM), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

DETAILED DESCRIPTION

Figure 1:
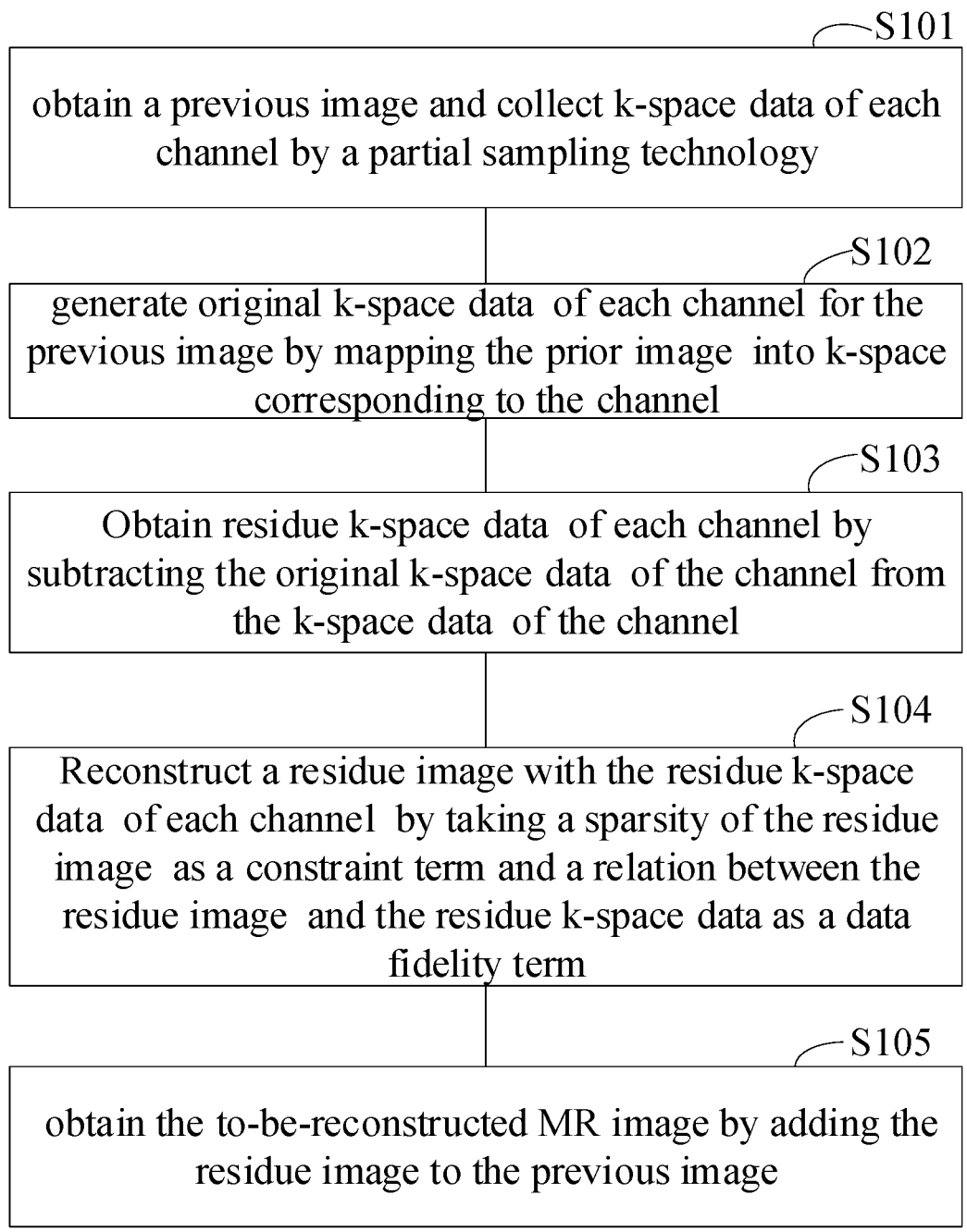
FIG. 1 is a schematic flowchart of a process of a method of reconstructing a magnetic resonance (MR) image according to one or more examples of the present disclosure.

Limited by some factors, such as spatial encoding, the imaging speed of MRI is relatively slow. To increase the imaging speed of MRI, partial sampling technologies, such as Parallel Imaging, Partial Fourier Imaging, and so on may be used. A Parallel Imaging sampling technology refers to that a plurality of receiving coils (hereinafter, may also be referred to as channels) respectively having known position and sensitivity are used to determine a spatial position of a magnetic resonance (MR) signal. A Partial Fourier Imaging sampling technology refers to that a part of the k-space (such as, one-half of the k-space) is collected while only a small low-frequency portion is collected on the other side of the k-space. When the partial sampling technology is used, a signal to noise ratio (SNR) of a reconstructed image is reduced and artefact of the reconstructed image is increased.

During collecting MR signals, since an MR signal is collected a plurality of times and a plurality of pulse sequences is used in each collection, when reconstructing an MR image, there are some prior (or pervious) images. These prior images can be used to improve the image reconstructing effect of the partial sampling technology, for example, noise can be reduced and/or artefact can be decreased.

During reconstructing an MR image, there are many sources of the prior images. In an example, during performing dynamic MRI, images corresponding to two adjacent image phases (may also be referred to as a former imaging phase and a latter imaging phase) are close. Therefore, the image corresponding to the former imaging phase may be taken as the prior image of the latter imaging phase. In another example, in Parallel Imaging, a map (image) for calculating coil sensitivity is used as a prior image of a to-be-reconstructed MR image. In still another example, when iterative reconstruction is performed, a former reconstructed MR image is used as a prior image of a subsequent to-be-reconstructed MR image.

In an example, the prior image is used as a constraint to improve the quality of a to-be-reconstructed MR image. In an MM method with the prior image, the corresponding target function $f(I)$ is expressed as the following formula (1):

$$f(I)=\|EI-K\|^2+\alpha\|I-I_o\|^2 \qquad (1).$$

Where, I represents a to-be-reconstructed MR image, $I_o$ represents a prior image, E represents an MR signal coding operator, K represents currently collected MR signal data, $\|EI-K\|^2$ represents a data fidelity term, which indicates the consistency between k-space data corresponding to the to-be-reconstructed MR image and the currently collected MR signal data, $\|I-I_o\|^2$ represents a constraint term and is used to restraint the to-be-reconstructed MR image and the prior image, $\alpha$ represents a non-negative parameter and is used to balance the data fidelity term and the constraint term. It is noted that by the constraint term, the k-space data corresponding to the to-be-reconstructed MR image is as close as possible to the currently collected MR signal data.

When reconstructing a target image, a to-be-reconstructed MR image I when the target function $f(I)$ reaches to a minimum can be taken as the target image. That is, when the function $f(I)$ reaches to a minimum, the to-be-reconstructed MR image I can be determined. The to-be-reconstructed MR image I is taken as the target image for diagnostic.

It is understood that, in the above formula (1), image domain data can be converted into frequency domain data (may also be referred to as the k-space data) by the MR signal coding operator E. In an example, the MR signal coding operator E is Fourier transform, that is, in the formula (1), EI=FFT(I). In another example, when the partial sampling technology is applied to the k-space, in the formula (1), EI=Mask×FFT(I). For a collected phase coding line, a value of Mask is 1; and for an uncollected phase coding line, the value of Mask is 0. In still another example, when a plurality of receiving coils are used to collect MR signal data, $EI=\Sigma_{j=1}^{N} S_j \times Mask \times FFT(I)$. Where, N represents a quantity of the receiving coils and $S_j$ represents coil sensitivity of channel j.

In a method of reconstructing an MR image with a prior image, to make k-space data corresponding to a to-be-reconstructed MR image consistent with the collected MR signal data as much as possible, in an image domain-based Parallel Imaging method, such as SENSE (SENSitivity Encoding) method, in an example, only the data fidelity term in the formula (1) is used. In this case, without the constraint term, it may cause that the signal to noise ratio (SNR) of the to-be-reconstructed MR image is relatively low. In another example, the data fidelity term and the constraint term in the formula (1) are both used. In this case, because a final reconstructing matrix is applied in the constraint term, some reconstructing skills, for example, a low resolution small matrix is applied to the SENSE method, cannot be used, thereby causing that the reconstructing speed is relatively slow.

In addition, it is noted that if an MR image is reconstructed with a prior image in a Partial Fourier Imaging method or a k-space-based Parallel Imaging method, such as GeneRalized Autocalibrating Partially Parallel Acquisitions (GRAPPA) method, iterative self-consistent parallel imaging reconstruction (SPIRiT) method, or the like, because the MR signal encoding operator E is complicated, it may cause that the image reconstruction process is complicated and difficult to implement in practical applications. Since the prior image belongs to the image domain, the prior image in the image domain cannot be directly applied to the k-space-based Parallel Imaging method. It is understood that when an MR image is reconstructed with a prior image in a k-space-based Parallel Imaging method, the prior image needs to be converted into the k-space with the MR signal encoding operator E. In this way, a dot product operation in the image domain becomes a convolution operation in the k-space. Therefore, the process of reconstructing an MR image with a prior image in a k-space-based Parallel Imaging method is relatively complicated.

Compared with the GRAPPA method, the SPIRiT method is iterative and adds a constraint.

Based on this, a method of reconstructing an MR image with a prior image is provided by examples of the present disclosure. The method of reconstructing an MR image with a prior image provided by the present disclosure can be applied not only to the image domain-based Parallel Imaging method, but also to the k-space-based Parallel Imaging method. In the method of reconstructing an MR image with a prior image provided by the present disclosure, original k-space data corresponding to the prior image is subtracted from k-space data collected by the partial sampling technology, so as to obtain residue k-space data; and then a residue image (approximately to a difference image between the to-be-reconstructed MR image and the prior image) is obtained with the residue k-space data. When obtaining the residue image, the k-space-based Parallel Imaging method and reconstructing skills can be applied. Finally, an MR image for diagnostic is generated by adding the residue image into the prior image.

The detailed description of the method of reconstructing an MR image provided by examples of the present disclosure is described in detail below with reference to the accompanying drawings.

FIG. 1 is a schematic flowchart of a process of a method of reconstructing an MR image according to one or more examples of the present disclosure. As shown in FIG. 1, the process includes the following steps S101-S105.

At step S101, a prior image $I_o$ is obtained and k-space data $K_j$ of each channel is collected by a partial sampling technology. Where, $j \in \{1, 2, 3, \ldots, J\}$ and J represents a quantity of channels in an MR system.

In the MRI field, there are many sources of the prior image $I_o$. In an example, when performing dynamic MRI, since images corresponding to a former imaging phase and a latter imaging phase are close, the image corresponding to the former imaging phase may be taken as the prior image of the latter imaging phase. In another example, in Parallel Imaging, a map for calculating coil sensitivity is used as a prior image of a to-be-reconstructed MR image. In still another example, when performing iterative reconstruction, a former reconstructed image is used as a prior image of a subsequent to-be-reconstructed MR image.

Therefore, in the present disclosure, the prior image may be obtained according to the application scenario of MM. In an example, if the MM is dynamic MRI, the image corresponding to the former imaging phase may be taken as the prior image $I_o$ of the latter imaging phase. In another example, if the MRI is iterative MRI, the former reconstructed image is used as the prior image of a subsequent to-be-reconstructed MR image.

In an example, in the method of reconstructing an MR image, a plurality of receiving coils (channels) are used. In this way, k-space data $K_j$ of each channel is collected by the partial sampling technology. Where, $j \in \{1, 2, 3, \ldots, J\}$ and J represents the quantity of channels in the MR system.

It is noted that the partial sampling technology refers to that for each channel, partial phase encoding lines (hereinafter, may also be referred to as partial lines) of the k-space are collected. In this way, when the sampling is finished, k-space data is filled on the collected partial phase encoding lines.

As an example, it is assumed that the sampling accelerating factor is 4. In this case, the partial sampling technology refers to that for each channel, first line, fifth line, . . . , (4 k+1)-th line of the k-space are collected. Where k is a nonnegative integer. In this way, when the sampling is finished, k-space data is filled on the first line, fifth line, . . . , (4 k+1)-th line of the k-space for each channel. The first line, fifth line, . . . , (4 k+1)-th line may also be referred to as collected lines. No data is filled on the other lines (such as, uncollected lines) of the k-space for each channel.

In an example, the partial sampling technology includes an equidistant partial sampling technology or a non-equidistant partial sampling technology. When the equidistant partial sampling technology is used, the subsequent image reconstructing process can be accelerated. In an example, the equidistant partial sampling technology refers to that a distance between every two adjacent collected lines for one channel is same.

At step S102, original k-space data $K_j^o$ of each channel for the prior image $I_o$ is generated by mapping the prior image $I_o$ into k-space corresponding to the channel.

According to a correspondence between the prior image $I_o$ and the original k-space data $K_j^o$ of each channel for the prior image $I_o$, the prior image $I_o$ is mapped into the k-space corresponding to each channel, to generate the original k-space data $K_j^o$ of each channel for the prior image $I_o$. In an example, the map for calculating coil sensitivity is taken as the prior image. It is understood that the original k-space data $K_j^o$ of each channel is full in the k-space.

It is noted that the correspondence between the prior image $I_o$ and the original k-space data $K_j^o$ of each channel for the prior image $I_o$ may be understood as a transformation relationship between the prior image $I_o$ and the original k-space data $K_j^o$ of each channel for the prior image $I_o$. For example, the original k-space data $K_j^o$ of each channel may be converted into the prior image $I_o$ by the inverse Fourier transform. The prior image $I_o$ may be mapped into the k-space corresponding to each channel by the Fourier transform, to generate the original k-space data $K_j^o$ of each channel for the prior image $I_o$.

The original k-space data $K_j^o$ of each channel for the prior image $I_o$ is generated according to the following formula (2):

$$K_j^o = FFT(I_o \times S_j) \qquad (2).$$

In the above formula (2), S represents coil sensitivity corresponding to the j-th channel, and $j \in \{1, 2, 3, \ldots, J\}$.

At step S103, residue k-space data k of each channel is obtained by subtracting the original k-space data $K_j^o$ of the channel from the k-space data $K_j$ of the channel.

It is noted that if the prior image $I_o$ is close enough to a to-be-reconstructed MR image, a residue image corresponding to the residue k-space data $\tilde{K}_j$ of each channel is sparse.

The residue k-space data $\tilde{K}_j$ of each channel is obtained by the following formula (3):

$$\tilde{K}_j = K_j - K_j^o \quad (3).$$

It is noted that since the k-space data $K_j$ of each channel is collected by the partial sampling technology, that is, in each channel, partial lines in the k-space are collected, rather than all lines in the k-space, subtracting the original k-space data $K_j^o$ of the channel from the k-space data $K_j$ of the channel includes: data on each collected lines in the k-space data $K_j$ respectively subtracts data on the corresponding line in the original k-space data $K_j^o$, regardless of uncollected lines for the channel. If one line in the k-space data $K_j$ is not collected, the subtracting process is not performed on the line. The subtracting process is only performed on the collected lines in the k-space data $K_j$.

In an example, it is assumed that the sampling accelerating factor is 4. In this case, the partial sampling technology refers to that for each channel, first line, fifth line, ..., (4 k+1)-th line of the k-space are collected. Where k is a nonnegative integer. That is, the first line, fifth line, ..., (4 k+1)-th line of the k-space has data. At step S103, the subtracting process is performed on k-space data on the first line, fifth line, ..., (4 k+1)-th line. The subtracting process is not performed on the uncollected lines. In this way, the residue k-space data $\tilde{K}_j$ of the channel only includes a difference between k-space data on the first line and original k-space data on the first line, a difference between k-space data on the fifth line and original k-space data on the fifth line, ..., and a difference between k-space data on the (4 k+1)-th line and original k-space data on the (4 k+1)-th line.

At step S104, with the residue k-space data $\tilde{K}_j$ of each channel, a residue image $\hat{I}$ is reconstructed by taking a sparsity of the residue image $\hat{I}$ as a constraint term and a relation between the residue image $\hat{I}$ and the residue k-space data $\tilde{K}_j$ as a data fidelity term.

Since the residue k-space data $\tilde{K}_j$ of each channel is obtained by subtracting the original k-space data $K_j^o$ of the channel from the k-space data $K_j$ of the channel, the residue image $\hat{I}$ corresponding to the residue k-space data $\tilde{K}_j$ of each channel is approximately equal to a differential image $I - I_o$ between a to-be-reconstructed MR image I and the prior image $I_o$.

To reconstruct the differential image $I - I_o$ between the to-be-reconstructed MR image I and the prior image $I_o$, in an example, by taking the sparsity of the residue image $\hat{I}$ as a constraint term and a relation between the residue image $\hat{I}$ and the residue k-space data $\tilde{K}_j$ as a data fidelity term, the residue image $\hat{I}$ is reconstructed with the residue k-space data $\tilde{K}_j$ of each channel. In an example, due to $\hat{I} \approx I - I_o$, the residue image $\hat{I}$ is taken as the differential image $I - I_o$ between the to-be-reconstructed MR image I and the prior image $I_o$.

It is noted by taking the sparsity of the residue image $\hat{I}$ as the constraint term and the relation between the residue image $\hat{I}$ and the residue k-space data $\tilde{K}_j$ as the data fidelity term, reconstructing the residue image $\hat{I}$ with the residue k-space data $\tilde{K}_j$ of each channel includes: determining the residue image $\hat{I}$ when a target function $f(\hat{I})$ reaches a minimum, and taking the residue image $\hat{I}$ as the differential image $I - I_o$ between the to-be-reconstructed MR image I and the prior image $I_o$. For channel j, the relation between the residue image $\hat{I}$ and the residue k-space data $\tilde{K}_j$ refers to a difference between virtual residue k-space data obtained by mapping the residue image $\hat{I}$ into the k-space of channel j and the residue k-space data $\tilde{K}_j$ of channel j.

In an example, the target function $f(\hat{I})$ is represented by the following formula (4):

$$f(\hat{I}) = \sum_{j=1}^{J} \left\| E_j \hat{I} - \tilde{K}_j \right\|^2 + \alpha \|\hat{I}\|^2. \quad (4)$$

In the above formula (4), $\hat{I}$ represents the to-be-determined residue image, $E_j$ represents an MR signal encoding operator of channel j, which is used to map the to-be-determined residue image $\hat{I}$ into the k-space corresponding to each channel, $\tilde{K}_j$ represents residue k-space data of channel j, $\|E_j \hat{I} - \tilde{K}_j\|^2$ is a data fidelity term, which indicates the consistency between the virtual residue k-space data obtained by mapping the to-be-determined residue image $\hat{I}$ into the k-space for channel j and the residue k-space data of channel j. That is, virtual residue k-space data obtained by mapping the to-be-determined residue image $\hat{I}$ into the k-space for channel j is as close as possible to the residue k-space data of channel j. $\|\hat{I}\|^2$ represents a constraint term of the to-be-determined residue image, which indicates a signal magnitude in the to-be-determined residue image $\hat{I}$ is relatively low. $\alpha$ represents a non-negative parameter and is used to balance the data fidelity term and the constraint term.

In the constraint term of the above formula (4), since the prior image $I_o$ is relatively close to the to-be-reconstructed MR image I, the to-be-determined residue image $\hat{I}$ is sparse, which means a quantity or portion of non-zero pixels in the to-be-determined residue image $\hat{I}$ is relatively low. In this way, the calculation of the constraint term is relatively easy. Further, the image domain-based Parallel Imaging method, such as the SENSE method, may use a low resolution small matrix to quickly reconstruct an MR image. Therefore, the reconstruction speed of reconstructing an MR image with a prior image is increased with the method provided in the present disclosure.

In addition, since the prior image $I_o$ is relatively close to the to-be-reconstructed MR image I, the differential image $I - I_o$ between the to-be-reconstructed MR image I and the prior image $I_o$ is sparse. The k-space-based Parallel Imaging method, such as the GRAPPA method, may atomically use the sparsity of the differential image $I - I_o$ (residue image $\hat{I}$), and thus the residue image $\hat{I}$ with relatively low noise and artefact can be obtained. The other fast imaging method, such as the Partial Fourier Imaging sampling method, may also atomically use the sparsity of the differential image $I - I_o$ (residue image $\hat{I}$), and thus the residue image $\hat{I}$ with relatively low noise and artefact can be obtained. That is, the MR image reconstruction method provided by the present disclosure enables that the Partial Fourier Imaging method and the k-space-based Parallel Imaging method, such as GRAPPA method, SPIRiT method, and so on can easily use the prior image to reconstruct an MR image with relatively low noise and artefact.

It can be seen that, at step S104, the residue image $\hat{I}$ may be reconstructed with a fast imaging method the in MR field. The fast imaging method the in MR field includes any of the image domain-based Parallel Imaging method, the k-space-based Parallel Imaging method and the Partial Fourier Imaging sampling method. The image domain-based Parallel Imaging method includes the SENSE parallel imaging method. The k-space-based Parallel Imaging method includes GRAPPA parallel imaging method and SPIRiT parallel imaging method.

At step S105, the to-be-reconstructed MR image I is obtained by adding the residue image Î to the prior image $I_o$.

Since the residue image Î is approximately equal to the differential image between the to-be-reconstructed MR image I and the prior image $I_o$, the to-be-reconstructed MR image I is obtained by adding the residue image Î to the prior image $I_o$.

The step S105 is expressed by the following formula (5):

$$I=I_o+(I-I_o)=I_o+\hat{I} \qquad (5).$$

In the method of reconstructing an MR image provided by the present disclosure, reconstructing skills can be applied when reconstructing the residue image, thereby increasing the reconstruction speed. In addition, the method of reconstructing an MR image provided by the present disclosure can be applied to the k-space-based Parallel Imaging method and the Partial Fourier Imaging sampling method, thereby implementing that in the k-space-based Parallel Imaging method and the Partial Fourier Imaging sampling method, the prior image is used to reconstruct an MR image with relatively low noise and artefact.

Based on the methods of reconstructing a magnetic resonance image provided by the present disclosure, the present disclosure further provides a device for reconstructing a magnetic resonance image.

Figure 2:
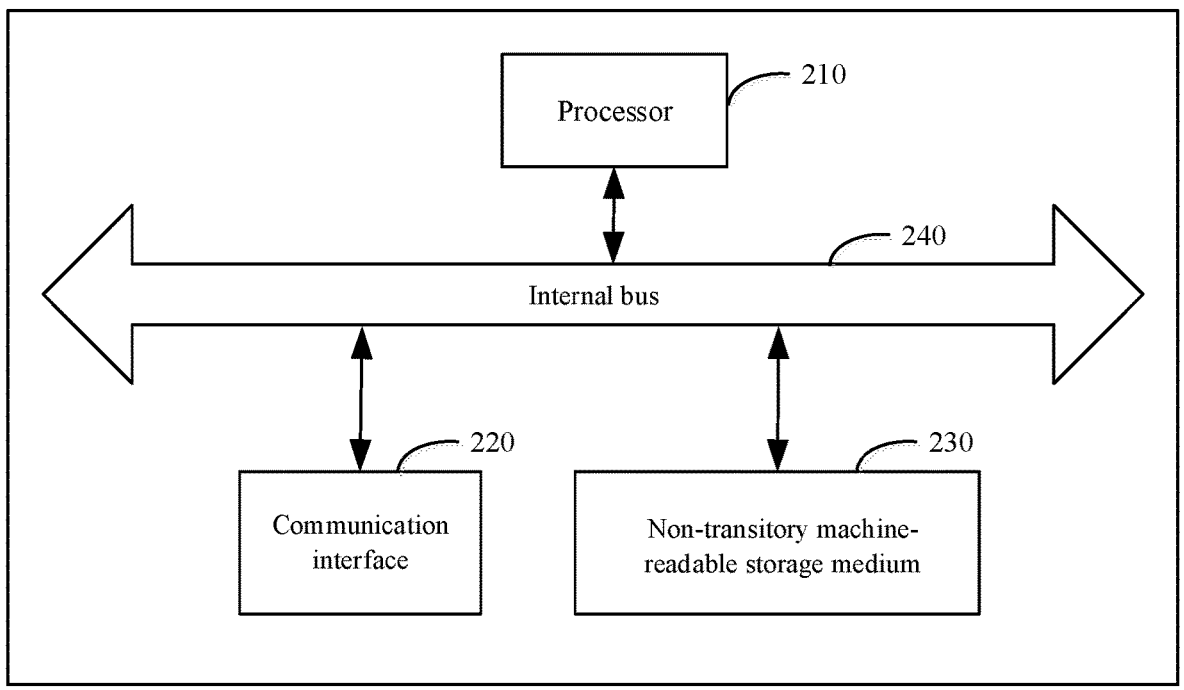
FIG. 2 is a schematic diagram of an example hardware structure of a device for reconstructing an MR image.

FIG. 2 is a schematic diagram of an example hardware structure of a device for reconstructing a magnetic resonance image. The device includes a processor 210, a communication interface 220, a non-transitory machine readable storage medium 230 and an internal bus 240. The processor 210, the communication interface 220 and the non-transitory machine readable storage medium 230 are typically connected to each other by the internal bus 240.

The processor 210 may be configured to read the machine executable instructions corresponding to control logic for reconstructing the magnetic resonance image stored on the non-transitory machine readable storage medium 230 to perform the method of reconstructing the magnetic resonance image described above.

It is noted that the device for reconstructing a magnetic resonance image corresponds to the method of reconstructing the magnetic resonance image. The device can reach a same technical effect as the method, and further detail is omitted for brevity.

Further, the present disclosure provides a non-transitory machine readable storage medium storing instructions executable by one or more processors. Upon such execution, the instructions cause the one or more processors to perform the method of reconstructing the magnetic resonance image described above. The non-transitory machine readable storage medium can reach a same technical effect as the method, and further detail is omitted for brevity.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A method of reconstructing a magnetic resonance image, the method comprising:
    obtaining a previous image $I_o$;
    for each of a quantity of channels in a magnetic resonance system:
        collecting k-space data $K_j$ of the channel by a partial sampling technology, wherein $j \in \{1, 2, 3, \ldots, J\}$ and wherein J is the quantity of channels;
        mapping the previous image $I_o$ into k-space of the channel to generate original k-space data $K_j^o$ of the channel;
        subtracting the original k-space data $K_j^o$ of the channel from the collected k-space data $K_j$ of the channel to generate residue k-space data $\tilde{K}_j$ of the channel;
    reconstructing a residue image Î with the residue k-space data $\tilde{K}_j$ of each of the channels; and
    obtaining a reconstructed magnetic resonance image I by adding the residue image Î to the previous image $I_o$;
    wherein reconstructing the residue image Î with the residue k-space data $\tilde{K}_j$ of each of the channels comprises:
        determining the residue image Î at which a target function $f(\hat{I})$ reaches a minimum value, wherein the target function $f(\hat{I})$ is expressed as a following formula (I):

$$f(\hat{I}) = \sum_{j=1}^{J} \left\| E_j \hat{I} - \tilde{K}_j \right\|^2 + \alpha \|\hat{I}\|^2, \qquad (I)$$

wherein $E_j$ represents a magnetic resonance signal encoding operator of channel j, which is used to map the residue image Î into the k-space of channel j,
wherein $\|E_j\hat{I}-\tilde{K}_j\|^2$ represents the data fidelity term,
wherein $\|\hat{I}\|^2$ represents the constraint term, and
wherein α represents a non-negative parameter used to balance the data fidelity term and the constraint term;
wherein $\|E_j\hat{I}-\tilde{K}_j\|^2 = \|s_j \times \text{Mask} \times \text{FFT}(\hat{I}) - \tilde{K}_j\|^2$,
wherein $S_j$ represents coil sensitivity of channel j,
wherein FFT represents Fourier transform,
wherein for a collected phase encoding line in channel j, Mask has a value of 1, and
wherein for an uncollected phase encoding line in channel j, Mask has a value of 0.

2. The method of claim 1, wherein mapping the previous image $I_o$ into k-space of each of the channels to generate original k-space data $K_j^o$ of each of the channels comprises:
mapping the previous image $I_o$ into the k-space of the channels according to a formula (II);
wherein the formula (II) is expressed as follows:

$$K_j^o = FFT(I_o \times S_j) \qquad (II),$$

wherein FFT represents Fourier transform, and
wherein $S_j$ represents coil sensitivity of each channel j.

3. The method of claim 1, wherein the previous image $I_o$ comprises any of:
a magnetic resonance image of a former imaging phase in dynamic magnetic resonance imaging;
a coil sensitivity map; and
a former magnetic resonance image in iterative reconstruction.

4. The method of claim 1, wherein the partial sampling technology comprises an equidistant partial sampling technology.

5. A device for reconstructing a magnetic resonance image, comprising:
a processor configured to execute machine executable instructions corresponding to control logic for reconstructing the magnetic resonance image, the instructions being stored on a non-transitory machine readable storage medium, whereby the instructions cause the device to perform a method comprising:
obtaining a previous image $I_o$;
for each of a quantity of channels in a magnetic resonance system:
collecting k-space data $K_j$ of the channel by a partial sampling technology, wherein $j \in \{1, 2, 3, \ldots, J\}$ and wherein J is the quantity of channels;
mapping the previous image $I_o$ into k-space of the channel to generate original k-space data $K_j^o$ of the channel;
subtracting the original k-space data $K_j^o$ of the channel from the collected k-space data $K_j$ of the channel to generate residue k-space data $\tilde{K}_j$ of the channel;
reconstructing a residue image $\hat{I}$ with the residue k-space data $\tilde{K}_j$ of each of the channels; and
obtaining a reconstructed magnetic resonance image I by adding the residue image $\hat{I}$ to the previous image $I_o$;
wherein reconstructing the residue image $\hat{I}$ with the residue k-space data $\tilde{K}_j$ of each of the channels comprises:
determining the residue image $\hat{I}$ at which a target function $f(\hat{I})$ reaches a minimum value, wherein the target function $f(\hat{I})$ is expressed as a following formula (I):

$$f(\hat{I}) = \sum_{j=1}^{J} \left\| E_j \hat{I} - \tilde{K}_j \right\|^2 + \alpha \|\hat{I}\|^2, \qquad (I)$$

wherein $E_j$ represents a magnetic resonance signal encoding operator of channel j, which is used to map the residue image $\hat{I}$ into the k-space of channel j, wherein $\|E_j\hat{I} - \tilde{K}_j\|^2$ represents the data fidelity term,
wherein $\|\hat{I}\|^2$ represents the constraint term, and
wherein $\alpha$ represents a non-negative parameter used to balance the data fidelity term and the constraint term;
wherein $\|E_j\hat{I} - \tilde{K}_j\|^2 = \|s_j \times Mask \times FFT(\hat{I}) - \tilde{K}_j\|^2$,
wherein $S_j$ represents coil sensitivity of channel j,
wherein FFT represents Fourier transform,
wherein for a collected phase encoding line in channel j, Mask has a value of 1, and
wherein for an uncollected phase encoding line in channel j, Mask has a value of 0.

6. The device of claim 5, wherein mapping the previous image $I_o$ into k-space of each of the channels to generate original k-space data $K_j^o$ of each of the channels comprises:
mapping the previous image $I_o$ into the k-space of the channel according to a formula (II);
wherein the formula (II) is expressed as follows:

$$K_j^o = FFT(I_o \times S_j) \qquad (II),$$

wherein FFT represents Fourier transform, and
wherein $S_j$ represents coil sensitivity of channel j.

7. The device of claim 5, wherein the previous image $I_o$ comprises any of:
a magnetic resonance image of a former imaging phase in dynamic magnetic resonance imaging;
a coil sensitivity map; and
a former magnetic resonance image in iterative reconstruction.

8. The device of claim 5, wherein the partial sampling technology comprises an equidistant partial sampling technology.

9. A non-transitory machine readable storage medium storing instructions executable by one or more processors and which, when executed, cause the one or more processors to perform a method comprising:
obtaining a previous image $I_o$;
for each of a quantity of channels in a magnetic resonance system:
collecting k-space data $K_j$ of the channel by a partial sampling technology, wherein $j \in \{1, 2, 3, \ldots, J\}$ and wherein J is the quantity of channels;
mapping the previous image $I_o$ into k-space of the channel to generate original k-space data $K_j^o$ of the channel;
subtracting the original k-space data $K_j^o$ of the channel from the collected k-space data $K_j$ of the channel to generate residue k-space data $\tilde{K}_j$ of the channel;
reconstructing a residue image $\hat{I}$ with the residue k-space data $\tilde{K}_j$ of each of the channels; and
obtaining a reconstructed magnetic resonance image I by adding the residue image I to the previous image $I_o$;
wherein reconstructing the residue image $\hat{I}$ with the residue k-space data $\tilde{K}_j$ of each of the channels comprises:
determining the residue image $\hat{I}$ at which a target function $f(\hat{I})$ reaches a minimum value, wherein the target function $f(\hat{I})$ is expressed as a following formula (I):

$$f(\hat{I}) = \sum_{j=1}^{J} \left\| E_j \hat{I} - \tilde{K}_j \right\|^2 + \alpha \|\hat{I}\|^2, \qquad (I)$$

wherein $E_j$ represents a magnetic resonance signal encoding operator of channel j, which is used to map the residue image $\hat{I}$ into the k-space of channel j,
wherein $\|E_j\hat{I} - \tilde{K}_j\|^2$ represents the data fidelity term,
wherein $\|\hat{I}\|^2$ represents the constraint term, and
wherein $\alpha$ represents a non-negative parameter used to balance the data fidelity term and the constraint term;
wherein $\|E_j\hat{I} - \tilde{K}_j\|^2 = \|s_j \times Mask \times FFT(\hat{I}) - \tilde{K}_j\|^2$,
wherein $S_j$ represents coil sensitivity of channel j,
wherein FFT represents Fourier transform,
wherein for a collected phase encoding line in channel j, Mask has a value of 1, and wherein for an uncollected phase encoding line in channel j, Mask has a value of 0.

10. The non-transitory machine readable storage medium of claim 9, wherein mapping the previous image $I_o$ into k-space of each of the channels to generate original k-space data $K_j^o$ of each of the channels comprises:

mapping the previous image $I_o$ into the k-space of the channel according to a formula (II);

wherein the formula (II) is expressed as follows:

$$K_j^o = FFT(I_o \times S_j) \quad \text{(II)};$$

wherein FFT represents Fourier transform, and
wherein $S_j$ represents coil sensitivity of channel j.

11. The non-transitory machine readable storage medium of claim 9, wherein the previous image $I_o$ comprises any of:
a magnetic resonance image of a former imaging phase in dynamic magnetic resonance imaging;
a coil sensitivity map; and
a former magnetic resonance image in iterative reconstruction.

12. The non-transitory machine readable storage medium of claim 9, wherein the partial sampling technology comprises an equidistant partial sampling technology.

* * * * *